United States Patent [19]
Ngo

[11] Patent Number: 5,986,329
[45] Date of Patent: Nov. 16, 1999

[54] DEPOSITION OF SUPER THIN PECVD SIO₂ IN MULTIPLE DEPOSITION STATION SYSTEM

[75] Inventor: Minh Van Ngo, Union City, Calif.

[73] Assignee: Advanced Micro Devices, Inc., Sunnyvale, Calif.

[21] Appl. No.: 08/813,021

[22] Filed: Mar. 7, 1997

[51] Int. Cl.⁶ .................................................. H01L 23/58

[52] U.S. Cl. ...................... 257/635; 219/405; 219/390; 219/411; 118/729; 118/725

[58] Field of Search ............................. 257/635; 219/405, 219/390, 411; 118/730, 729, 725, 724; 437/240, 982, 236

[56] References Cited

U.S. PATENT DOCUMENTS

| | | | |
|---|---|---|---|
| 5,683,518 | 11/1997 | Moore et al. | 118/730 |
| 5,710,407 | 1/1998 | Moore et al. | 219/405 |
| 5,770,469 | 6/1998 | Uram et al. | 437/240 |

*Primary Examiner*—Carl Whitehead, Jr.
*Attorney, Agent, or Firm*—Sawyer & Associates

[57] ABSTRACT

The present invention provides a method and system for depositing an oxide layer onto a semiconductor device during fabrication by using a deposition chamber, the method comprising the steps of providing a temperature of less than approximately 450 degrees Celsius in the deposition chamber; allowing the semiconductor wafer to soak up the temperature of less than approximately 450 degrees Celsius for approximately 30 seconds; and depositing a layer of oxide onto a semiconductor wafer, wherein a thickness of the oxide layer is not greater than approximately 200 Angstroms.

13 Claims, 6 Drawing Sheets

DEPOSITION OF SUPER THIN PECVD SIO₂ IN MULTIPLE DEPOSITION STATION SYSTEM

FIELD OF THE INVENTION

The present invention relates to a method and system for depositing an oxide layer onto a semiconductor device during manufacturing, and a semiconductor device resulting therefrom.

BACKGROUND OF THE INVENTION

Semiconductor devices, such as those used for microprocessors, are typically fabricated by bonding silicon dioxide layers on a silicon substrate. The silicon dioxide layers are selectively etched away with a plasma current to expose the silicon substrate. Exposed silicon on either side of a non-etched area is typically implanted with ions to create source and drain areas. The conductive layer is then deposited on the nonexposed area to create a gate for the transistors. Additional conductive layers are then typically disposed on the source and drain areas to provide electrical connection thereto. The conductive layers are separated by a dielectric material and multiple layers of conductive material are also disposed elsewhere on the substrate to provide pads for external connection to the devices.

A particular set of steps utilized in the fabrication of semiconductor devices include a first implant step, the deposition of a layer of oxide, and a second implant step.

In a conventional method, the oxide layer is grown by utilizing a high temperature, such as a temperature approximating 900° C., and using oxygen gas to grow a thin oxide layer, such as a thickness of approximately 100 Angstroms. A problem with using this conventional method is that the high temperature required tends to drive the first implant material too far into the silicon substrate. This unwanted thermal driving of the implant material can cause semiconductor devices to be unsuitable for sophisticated, high performance use.

One method which addresses the problems caused by the required use of such a high temperature is a method utilizing plasma enhanced chemical vapor deposition (PECVD). This alternative method is commonly referred to as Novellus Concept 1. The Novellus Concept 1 allows the use of a low temperature, such as approximately 400° C., thus addressing the problem of driving the first implant material too far into the silicon substrate.

However, when the temperature is reduced from a high temperature such as 900° C. to a low temperature such as 400° C., the very thin oxide film property becomes very porous and tends to be very poor quality, thus allowing too much implant material to flow through the oxide layer. Additionally, it is highly difficult to control each deposition station such that only the minuscule required amount of oxide is deposited. For example, if five stations are used in the deposition chamber, and an oxide thickness of 100 Angstroms is desired, each station would need to contribute only 20 Angstroms to the oxide thickness. This kind of fine control would be extremely difficult. Consequently, the oxide layer resulting from the Novellus Concept 1 is typically very thick, such as approximately 500 Angstroms.

A problem with such a thick oxide layer is that not enough of the implant material can penetrate through the oxide layer.

What is needed is a method and system for providing an oxide layer for a semiconductor device during fabrication which utilizes a relatively low temperature and produces a very thin oxide layer which has properties sufficient to properly perform its function of allowing an acceptable amount of implant material to penetrate through it. The present invention addresses such a need.

SUMMARY OF THE INVENTION

The present invention provides a method and system for depositing an oxide layer onto a semiconductor device during fabrication by using a deposition chamber, the method comprising the steps of providing a temperature of less than approximately 450 degrees Celsius in the deposition chamber; allowing the semiconductor wafer to soak up the temperature of less than approximately 450 degrees Celsius for less than approximately 30 seconds; and depositing a layer of oxide onto a semiconductor wafer, wherein a thickness of the oxide layer is not greater than approximately 200 Angstroms.

DETAILED DESCRIPTION OF THE INVENTION

The present invention relates to a method and system for providing an oxide layer on a semiconductor wafer, and a semiconductor device created therefrom. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
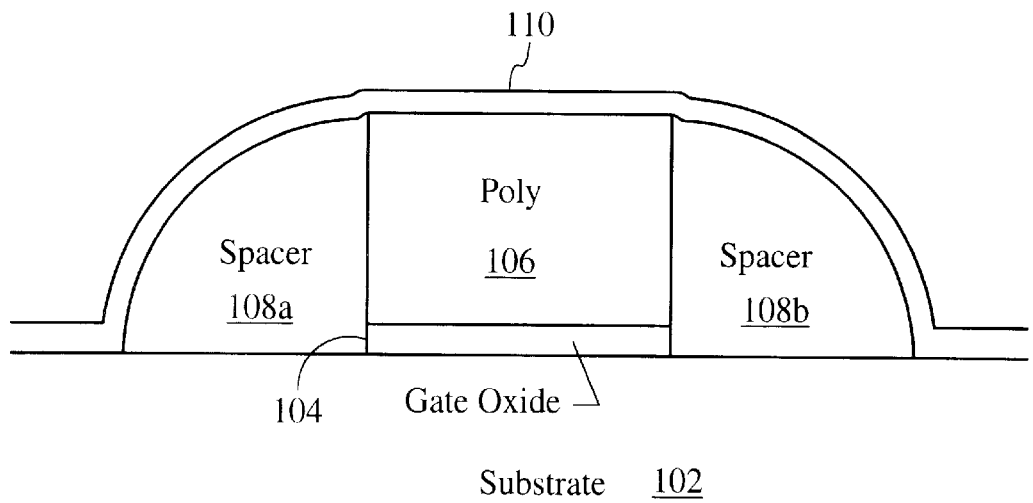
FIG. 1 is a cross-section of a semiconductor device during formation.

FIG. 1 is a block diagram of a cross-section of a semiconductor device, such as a Microprocessor, during formation. A portion of the semiconductor device 100 shown in FIG. 1 includes a substrate 102 with a gate oxide 104 and (polysilicon) 106 located above the substrate 102. Spacers 108a–108b are shown located along the sides of the poly 106. Above the substrate 102, spacers 108a–108b, and poly 106 is a layer of spacer oxide 110.

Figure 2:
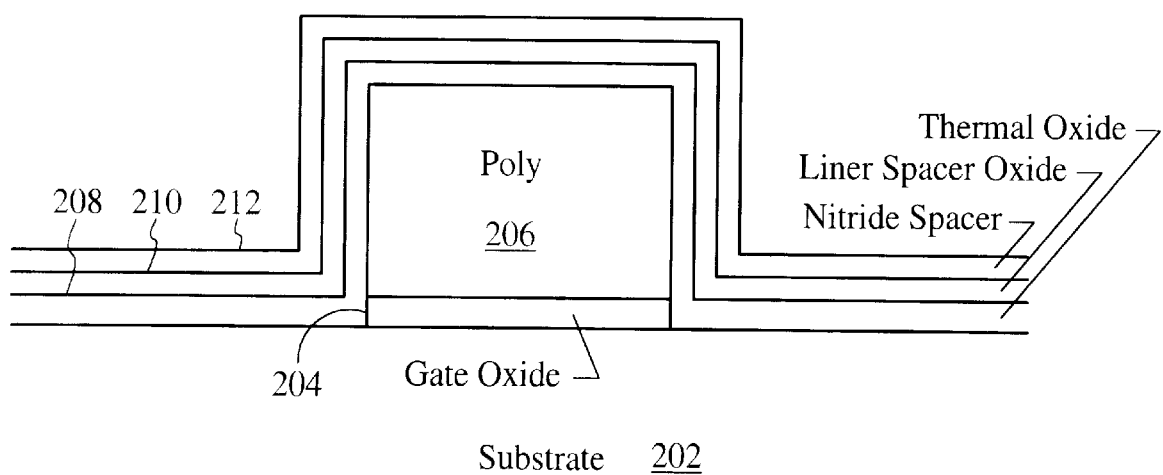
FIG. 2 is another cross-section of a semiconductor device during formation.

Another situation in which a layer of oxide is typically used is shown in FIG. 2. FIG. 2 shows another cross-section of a semiconductor device 200, such as a Microprocessor, during formation. The portion of the semiconductor device 200 shown in FIG. 2 includes the substrate 202 with gate oxide 204 and poly 206 positioned above the substrate 202. A layer of thermal oxide 208 is shown above the substrate 202 and poly 206. A layer of liner spacer oxide 210 is shown above the layer of thermal oxide 208. A layer of nitride spacer 212 is positioned above the liner spacer oxide 210.

Figure 3:
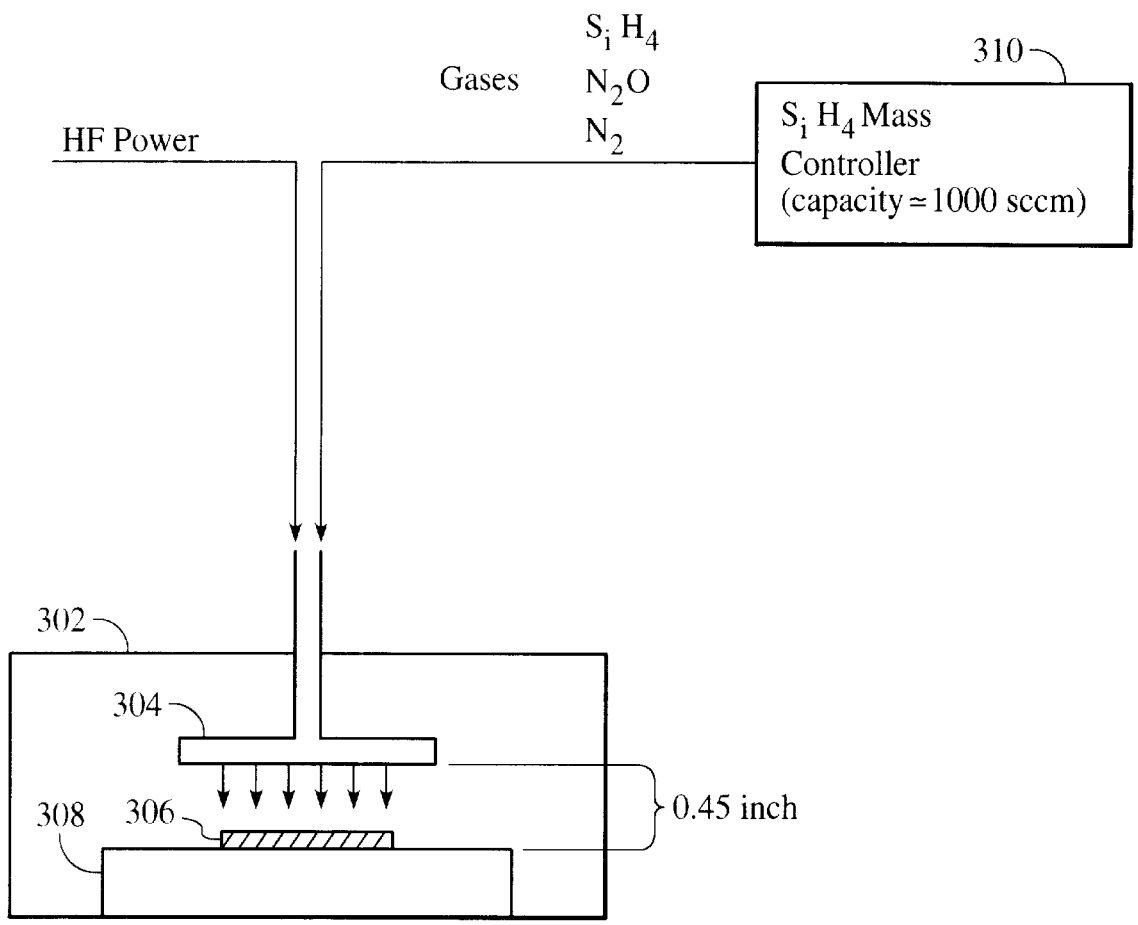
FIG. 3 is a conventional system for depositing an oxide layer onto a semiconductor wafer.

For either of the oxide layers in the semiconductor devices shown in FIGS. 1 and 2, a system such as the system shown in FIG. 3 is typically used to deposit the oxide layers. FIG. 3 shows a block diagram of a conventional system for depositing an oxide layer onto a semiconductor wafer. The system 300 includes a deposition chamber 302, and a mass flow controller 310. The deposition chamber 302 includes a shower head 304, and a heater block 308 upon which the semiconductor wafer 306 is positioned. The mass flow controller 310 used in the conventional systems 300 typically has a flow capacity of approximately 1000 sccm. Gases, such as $SiH_4$, $N_2O$, $N_2$, typically flow through the mass flow controller 310 into the deposition chamber 302 via the shower head 304 and are deposited onto the semiconductor wafer 306. Typically, the gap between the shower head 304 and the heater block 308 is approximately 0.45 inch.

Figure 4:
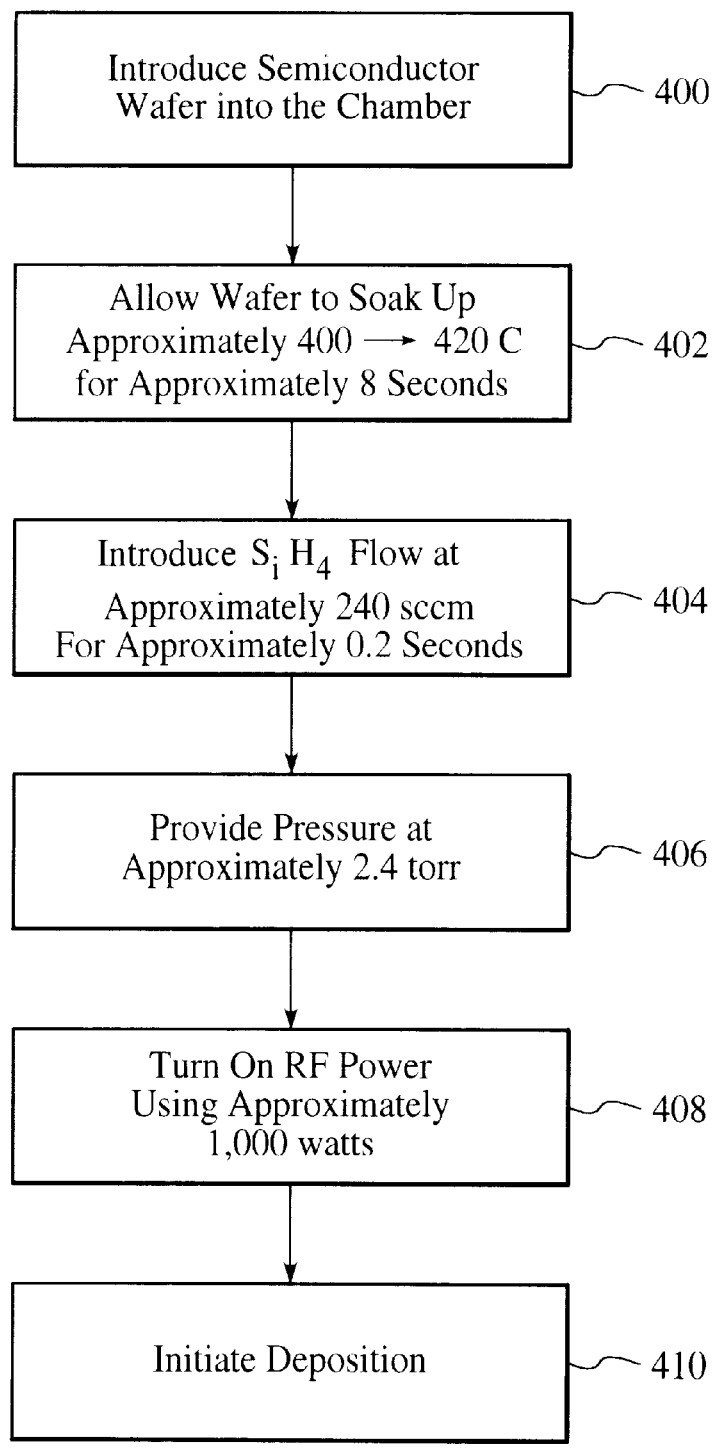
FIG. 4 is a conventional method for depositing an oxide layer onto the semiconductor wafer.
Figure 5:
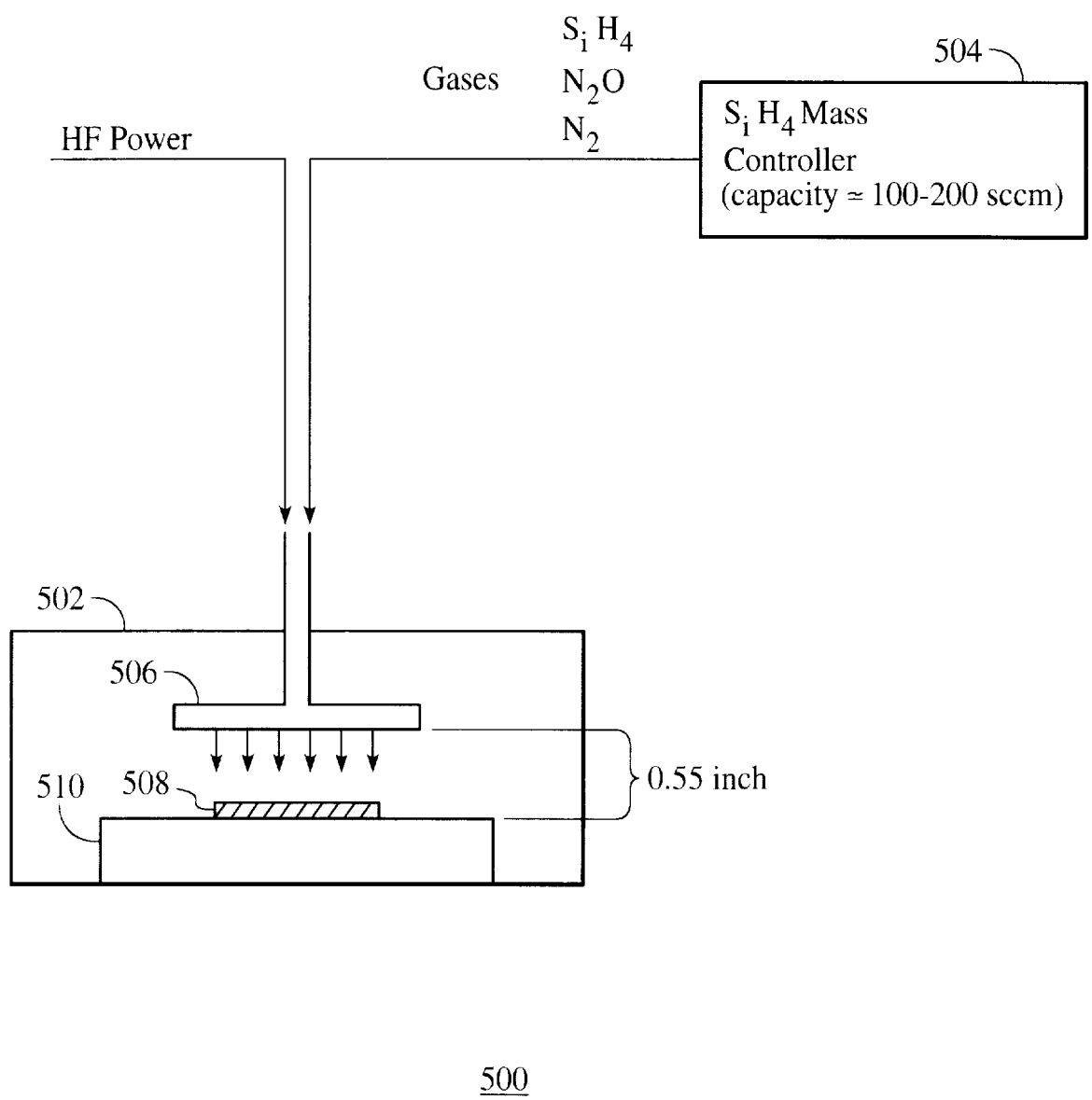
FIG. 5 is a block diagram of a system of depositing an oxide layer according to the present invention.
Figure 6:
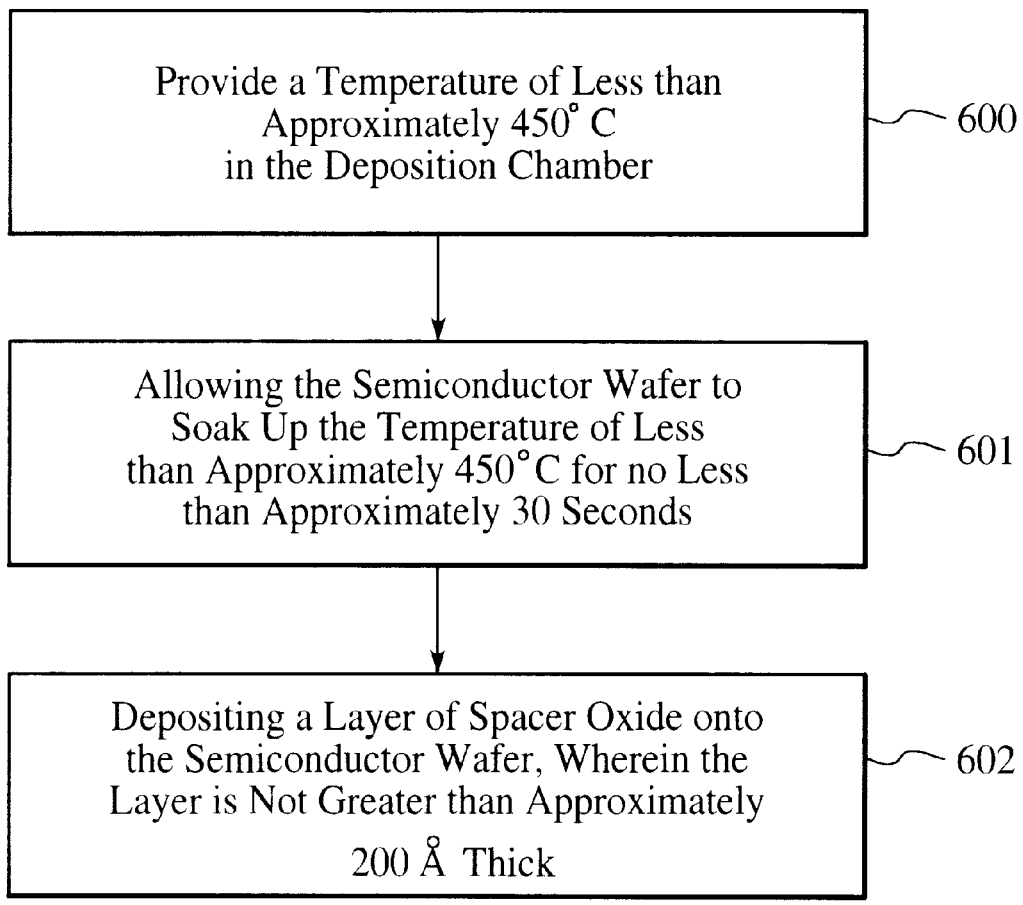
FIG. 6 is a flow diagram of a method according to the present invention.
Figure 7:
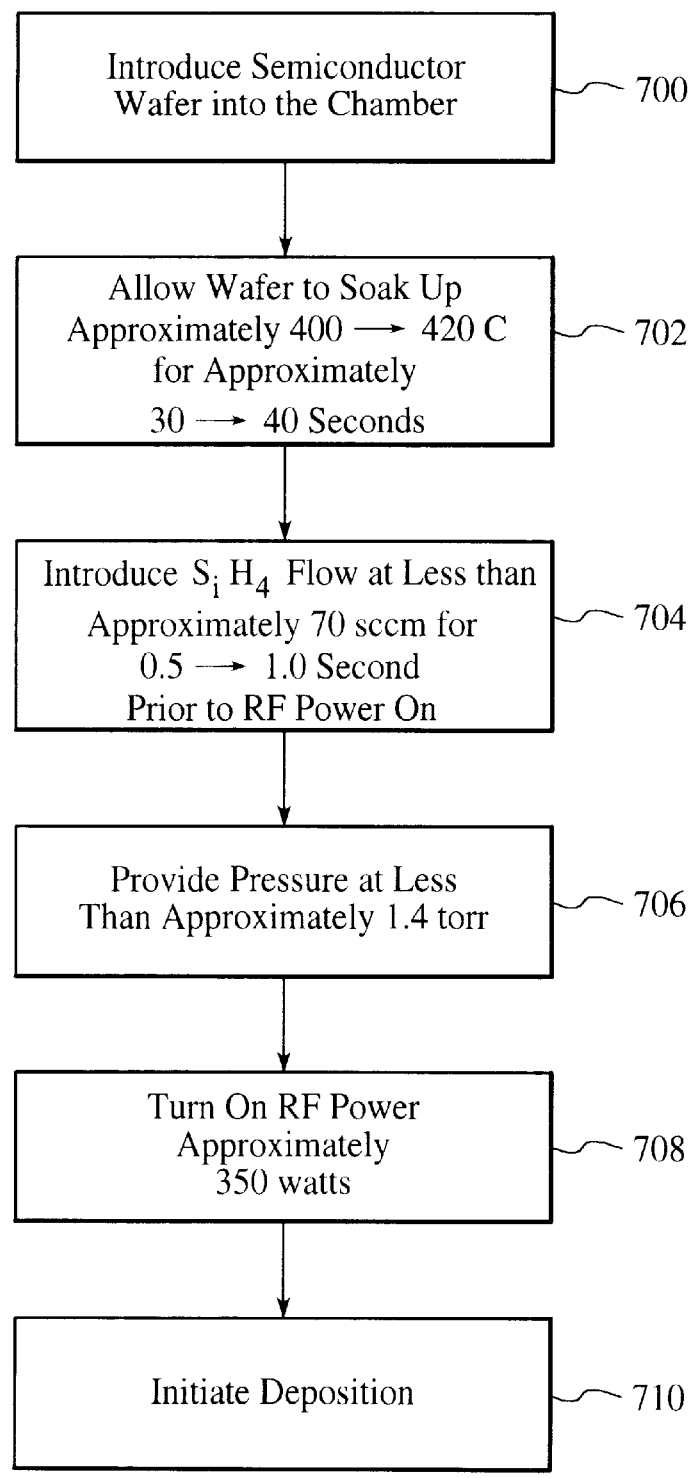
FIG. 7 is a more detailed flow diagram of the method according to the present invention.

FIG. 4 is a flow diagram of a conventional method of depositing an oxide layer onto semiconductor wafer 306. The wafer is introduced into the deposition chamber 302 of FIG. 3 via step 400. The wafer is then allowed to soak up temperature of approximately 400° C. for approximately 8 seconds via step 402. $SiH_4$ is introduced at a flow of approximately 240 sccm for approximately 0.2 second via step 404. The pressure is provided at approximately 2.4 torr via step 406. The RF power is then turned on using approximately 1000 watts via step 408. Finally, deposition is initiated via step 410.

As previously discussed, the conventional methods have successfully produced a thin oxide layer, such as a layer with thickness of 100 Angstroms, by using a high temperature, such as 900° C. However, the result of the use of such high temperatures tends to drive the material used in the implantation phase too far into the silicon substrate. Consequently, this conventional method can cause semiconductor devices to be unsuitable for sophisticated, high performance use.

Alternatively, low temperatures, such as 400° C., can be used by utilizing plasma enhanced chemical vapor deposition (PECVD) in another conventional method, however, the resulting oxide layer is typically too thick to meet implant penetration requirements. One reason why the resulting oxide layer is so thick (typically approximately 500 Angstroms) is that the typical deposition system utilizes multiple deposition stations. Each deposition station would need to provide a portion of the resulting thickness. For example, if five deposition stations are used, then each station would need to provide one-fifth of the total thickness of the oxide layer. Hence, if the desired thickness is 100 Angstroms, then each station would need to provide approximately 20 Angstroms. It is extremely difficult to control the system to provide a mere 20 Angstroms per station. chamber via step 700. The wafer is then allowed to soak up the temperature for approximately 30–40 seconds via step 702. The preferable temperature is approximately 400–420° C.

In contrast, the conventional method only allows the wafer to adjust to chamber conditions for approximately 8 seconds.

In the method according to the present invention, $SiH_4$ is introduced at less than approximately 70 sccm for approximately 0.5→1.0 second prior to RF power turn on, via step 704. The pressure is provided at less than approximately 1.4 torr, via step 706, and RF power required approximately 350 watts via step 708. Finally, deposition is initiated via step 710.

In contrast, in conventional methods, $SiH_4$ is introduced at a flow of approximately 240 sccm for approximately 0.2 seconds. Pressure in the conventional method is provided at approximately 2.4 torr, and the RF power typically requires much greater power than in the present invention, such as approximately 1,000 watts.

A preferred process recipe for a method according to the present invention for providing a thin oxide layer is as follows:

$SiH_4$=68 Sccm $N_2O$=8,000 Sccm $N_2$=2500 Sccm

RF power=350 watts

Pressure=1.2 Torr

Temperature=420° C.

Precoat Time=360 seconds

Soak Time=30 seconds

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for depositing an oxide layer onto a semiconductor device during fabrication, the system comprising:

a deposition chamber for depositing a layer of oxide onto a semiconductor wafer, the deposition chamber including a heater and a shower head, wherein a gap between the heater and the shower head is greater than approximately 0.45 inch; and a mass flow controller coupled to the deposition chamber, wherein the mass flow controller has a flow capacity of less than approximately 1000 sccm.

2. The system of claim 1, wherein gas is introduced into the deposition chamber approximately 0.5–1.0 second prior to turning on power.

3. The system of claim 1, further comprising a power source using approximately 350 watts.

4. The system of claim 1, wherein the mass flow controller has a capacity of approximately 100–200 sccm.

5. The system of claim 1, wherein the gap between the shower head and the heater is approximately 0.55 inch.

6. The system of claim 1, wherein $SiH_4$ flow is introduced into the deposition chamber at less than approximately 70 sccm.

7. The system of claim 1, wherein a pressure in the deposition chamber is less than approximately 1.4 Torr.

8. The system of claim 1, wherein a semiconductor wafer is introduced into the deposition chamber and allowed to adjust to chamber conditions for approximately 30–45 seconds.

9. The system of claim 1, wherein the temperature is approximately 400–420 degrees Celsius.

10. The system of claim 1, wherein the thickness of the oxide layer is not greater than approximately 200 angstroms.

11. The system of claim 1, wherein the thickness of the oxide layer is not greater than approximately 100 angstroms.

12. A semiconductor device comprising:

a substrate;

a (polysilicon) positioned above the substrate;

an oxide layer positioned above the poly and the substrate, wherein the oxide layer is not greater than approximately 200 angstroms, and wherein the oxide layer was deposited in conditions including a temperature of less than approximately 450 degrees Celsius.

13. A system for depositing an oxide layer onto a semiconductor device during fabrication, the system comprising:

means for depositing a layer of oxide onto a semiconductor wafer, the deposition means including a heating means and a showering means, wherein a gap between the heating means and the showering means is greater than approximately 0.45 inch; and means for controlling flow coupled to the deposition means, wherein the controlling means has a flow capacity of less than approximately 1000 sccm.

* * * * *